United States Patent
Kokubu

(10) Patent No.: US 6,713,380 B2
(45) Date of Patent: Mar. 30, 2004

(54) METHODS FOR DRY ETCHING AT LOW SUBSTRATE TEMPERATURES USING GAS CHEMISTRY INCLUDING A FLUOROCARBON GAS AND A GAS INCLUDING OXYGEN

(75) Inventor: Takashi Kokubu, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/146,865

(22) Filed: May 16, 2002

(65) Prior Publication Data

US 2003/0036285 A1 Feb. 20, 2003

(30) Foreign Application Priority Data

May 16, 2001 (JP) ........................................ 2001-146393

(51) Int. Cl.[7] ............................................ H01L 21/465
(52) U.S. Cl. ...................... 438/620; 438/715; 438/723; 438/738; 216/67
(58) Field of Search ...................... 216/67, 70; 438/620, 438/637, 672, 675, 715, 723, 728, 732, 738; 156/345.43, 345.46, 345.53

(56) References Cited

U.S. PATENT DOCUMENTS

| | | | |
|---|---|---|---|
| 4,207,137 A | * | 6/1980 | Tretola .......................... 438/10 |
| 4,751,191 A | * | 6/1988 | Gonsiorawski et al. ........ 438/72 |
| 5,411,624 A | * | 5/1995 | Hirano et al. ........... 156/345.46 |
| 5,660,671 A | * | 8/1997 | Harada et al. .......... 156/345.46 |
| 5,785,877 A | * | 7/1998 | Sato et al. ..................... 216/67 |
| 5,865,938 A | * | 2/1999 | Peeters et al. .......... 156/345.51 |
| 5,906,948 A | * | 5/1999 | Liu et al. ..................... 438/689 |
| 5,922,622 A | * | 7/1999 | Lee et al. .................... 438/734 |
| 6,046,478 A | * | 4/2000 | Klein .......................... 257/350 |
| 6,254,683 B1 | * | 7/2001 | Matsuda et al. ............. 118/500 |
| 6,340,632 B1 | * | 1/2002 | Fukada et al. ............... 438/622 |
| 6,355,518 B1 | * | 3/2002 | Wu et al. ..................... 438/246 |
| 6,451,708 B1 | * | 9/2002 | Ha .............................. 438/738 |
| 2002/0158339 A1 | * | 10/2002 | Yamamoto ................... 257/758 |
| 2002/0182880 A1 | * | 12/2002 | Zhu et al. .................... 438/724 |

FOREIGN PATENT DOCUMENTS

JP 2000-349150 A * 12/2000 ......... H01L/21/768

OTHER PUBLICATIONS

"Etching of Si at Low Temperature by Hitachi—Improved Anisotropy and Selectivity, and Satisfactory Speed," Semiconductor World, vol. 7, No. 1, pp. 58–59 (1988).* article in Monthly Semiconductor World 1998, vol. 1, pp. 58–63 (1998).

* cited by examiner

Primary Examiner—Carl Whitehead, Jr.
Assistant Examiner—Stephen W. Smoot
(74) Attorney, Agent, or Firm—Konrad Raynes & Victor, LLP; Alan S. Raynes

(57) ABSTRACT

Methods for fabricating semiconductor devices are described, including methods which improve an etching selection ratio of a film to be etched against metal silicide, Si, and photoresist. One method for fabricating a semiconductor device includes the steps of forming Ti silicide films 9a–9c on the gate electrode 3 and the diffusion layers 6 and 7 of source/drain regions, forming an interlayer dielectric film 10 on the Ti silicide films, and dry-etching the interlayer dielectric film to form in the interlayer dielectric film 10 a contact hole 10a located above the gate electrode, and contact holes 10b and 10c located above the diffusion layers of the source/drain regions, wherein etching gas used for the dry-etching is gas including at least fluorocarbon gas and one of $O_2$ gas and $O_3$ gas, and the temperature of the semiconductor substrate is 30° C. or lower when the dry-etching is conducted.

14 Claims, 5 Drawing Sheets

METHODS FOR DRY ETCHING AT LOW SUBSTRATE TEMPERATURES USING GAS CHEMISTRY INCLUDING A FLUOROCARBON GAS AND A GAS INCLUDING OXYGEN

Applicant hereby incorporates by reference Japanese Application No. 2001-146393 (P), filed May 16, 2001, in its entirety.

TECHNICAL FIELD

The present invention relates to etching methods, apparatus and methods for fabricating a semiconductor device. More particularly, the present invention includes certain embodiments relating to etching methods, apparatus and methods for fabricating a semiconductor device, which improve an etching selection ratio of a film to be etched against metal silicide, Si, and photoresist.

RELATED ART

In conventional dry-etching methods, a plasma of halogen gas is generated in a processing chamber, and the action of ions, radicals and electrons in the plasma are used to conduct an etching. These methods are known as plasma etching methods.

Many proposals have been made to increase the etching speed while improving the etching selectivity in such etching methods. For example, as one of the etching methods to increase the etching speed at the time of etching silicon and silicon oxide while decreasing the etching speed for photoresist, a method has been proposed in which fluorocarbon etching gas such as $CHF_3$ and the like is used, and the substrate temperature is controlled to be below zero degrees Centigrade when the etching is conducted. This method is advantageous when etching of a Si film or a Si substrate and etching of a $SiO_2$ film are to be conducted at the same time.

Also, in another proposed method to increase the etching speed for Si and to slow down the etching speed for $SiO_2$ and photoresist, $SF_6$ is used as etching gas, and the substrate temperature is controlled to be −100 to 130° C. when the etching is conducted (see Monthly Semiconductor World 1998, 1, p58). This method is advantageous when a $SiO_2$ film is not etched, but only a Si film or a Si substrate is to be etched.

SUMMARY

Certain embodiments relate to an etching method including supplying etching gas onto a member to be processed, and forming a plasma in at least part of the etching gas for etching the member to be processed by the plasma. The etching method includes maintaining the member to be processed at temperatures of 30° C. or lower when etching is conducted, and using gas including a fluorocarbon gas and at least one of $O_2$ gas and $O_3$ gas as the etching gas.

Embodiments also relate to an etching apparatus for etching a member to be processed by plasma, including a maintaining system that cools and maintains the member to be processed at temperatures of 30° C. or lower when etching is conducted, a supply system that supplies etching gas onto the member to be processed, and a plasma system that forms a plasma in at least part of the etching gas supplied by the supply system. A gas including a fluorocarbon gas and at least one of $O_2$ gas and $O_3$ gas is used as the etching gas.

Embodiments also relate to a method for fabricating a semiconductor device, the method including forming a dielectric film on a base comprising at least one material selected from the group of a metal silicide and Si. The method also includes dry-etching the dielectric film to form in the dielectric film first and second contact holes that expose surfaces of the base. The amount of etching in forming the first contact hole is less than the amount of etching in forming the second contact hole. The etching gas used for the dry-etching is gas includes a fluorocarbon gas and at least one of $O_2$ gas and $O_3$ gas. The temperature of the base is 30° C. or lower when the dry-etching is conducted.

Embodiments also relate to a method for fabricating a semiconductor device, the method including forming a gate electrode on a semiconductor substrate, forming diffusion layers in source/drain regions of the semiconductor substrate, and forming a metal silicide film on the gate electrode and the diffusion layers of source/drain regions. The method also includes forming a silicon oxide film on the metal silicide film. The method also includes dry-etching the silicon oxide film to form in the silicon oxide film a first contact hole located over the gate electrode, and second contact holes located over the diffusing layers in the source/drain regions. The etching gas used for the dry-etching is gas including a fluorocarbon gas and at least one of $O_2$ gas and $O_3$ gas, and the temperature of the semiconductor substrate is 30° C. or lower when the dry-etching is conducted.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
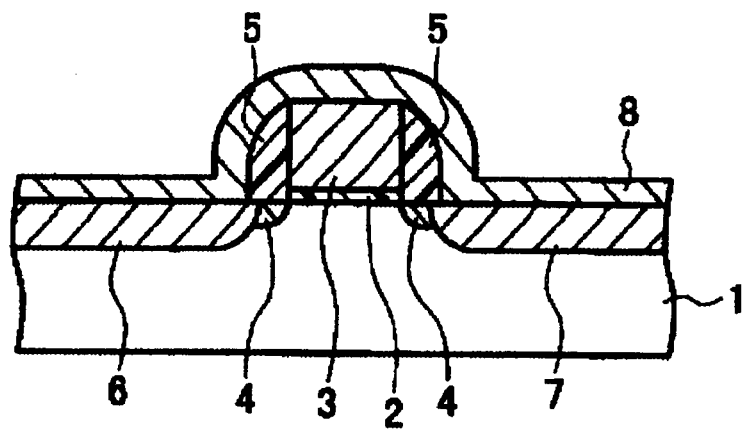
FIG. 1 is a cross-sectional view showing a portion of a method for fabricating a semiconductor device in accordance with an embodiment of the present invention.

In processes for fabricating semiconductor devices, there are occasions, for example, when it is desired to etch only a SiO$_2$ film, but not to etch Si, silicide or photoresist. More specifically, in one example, a salicide process is conducted to form silicide films over the gate elect and the diffusion layers in the source/drain regions, a SiO$_2$ film is formed over the entire surface including the silicide film, a photoresist film is provided over the SiO$_2$ film, and the SiO$_2$ film is etched by a plasma etching apparatus using the photoresist film as a mask to thereby form contact holes in the SiO$_2$ film at locations over the silicide film. At the time of the etching step, the etching step needs to be conducted until the surface of the silicide film is exposed, and the desired etching amount is less over the gate electrode and more over the diffusion layers because the contact hole over the gate electrode and the contact hole over the diffusion layers are different in depth. Therefore, to form these contact holes in one etching step at the same time in a short period of time, the etching needs to be conducted in a manner that the etching speed for the silicide film is very slow, but the etching speed for the SiO$_2$ film is very fast.

However, in the conventional dry-etching method, the etching selection ratio of a SiO$_2$ film against a silicide film and a photoresist film is small, such that the silicide film and the photoresist film may be excessively cut at the contact holes with small etching amounts. As a result, an abnormality such as an increased contact resistance may occur, and the hole diameter of contact holes may become too large as a result of the excessive cutting of the photoresist film, which causes size variations and deteriorates the size controllability.

Certain embodiments of the present invention are made in view of the problems described above, and its object is to provide etching methods, an etching apparatus and methods for fabricating a semiconductor device, in which an etching selection ratio of a film to be etched against metal silicide, Si and photoresist is improved.

One example of an etching method in accordance with certain embodiments pertains to an etching method in which etching gas is supplied onto a member to be processed, and at least part of the etching gas is plasmatized for etching the member to be processed by the plasma, the etching method comprising: maintaining the member to be processed at temperatures of 30° C. or lower when etching is conducted; and using gas including at least fluorocarbon gas and one of O$_2$ gas and O$_3$ gas as etching gas.

For example, C$_4$F$_8$ gas, C$_5$F$_6$ gas and the like may preferably be used as the fluorocarbon gas.

In accordance with the etching method above, the member to be processed is maintained at temperatures of 30° C. or lower, and gas including at least fluorocarbon gas and one of O$_2$ gas and O$_3$ gas is used as the etching gas. For this reason, the etching selection ratio of a film to be etched against a metal silicide film, Si, and photoresist can be increased to be high.

Also, in the etching method in accordance with certain embodiments of the present invention, the etching gas may preferably further include CO gas or CO$_2$ gas.

Also, in the etching method in accordance with certain embodiments of the present invention, the etching gas may preferably further include Ar gas or He gas.

An etching apparatus in accordance with an embodiment of the present invention pertains to an etching apparatus for etching a member to be processed by plasma, the etching apparatus comprising: a maintaining system that cools and maintains the member to be processed at temperatures of 30° C. or lower when etching is conducted; and a supply system that supplies etching gas onto the member to be process; and a plasmatizing system that plasmatizes at least part of the etching gas supplied by the supply system, wherein gas including at least fluorocarbon gas and one of O$_2$ gas and O$_3$ gas is used as the etching gas.

Also, in the etching apparatus in accordance with certain embodiments of the present invention, the etching gas may preferably further include CO gas or CO$_2$ gas.

Also, in the etching apparatus in accordance with certain embodiments of the present invention, the etching gas may preferably further include Ar gas or He gas.

Also, in the etching apparatus in accordance with certain embodiments of the present invention, the maintaining system may preferably be equipped with a mounting base for mounting thereon the member to be processed, and a cooling gas supply device that supplies cooling gas onto the mounting base, wherein the mounting base is cooled by the cooling gas, and the temperature of the member to be processed is maintained at 30° C. or lower through the mounting base.

Also, in the etching apparatus in accordance with certain embodiments of the present invention, the plasma system may preferably include a cathode electrode and an anode electrode disposed such that the member to be processed is interposed therebetween, a chamber that stores the member to be processed, and a magnet disposed outside the chamber, wherein plasma is generated with the etching gas between the cathode electrode and the anode electrode.

A method for fabricating a semiconductor device in accordance with certain embodiments of the present invention comprises the steps of: forming a dielectric film on a base composed of a metal silicide or Si; and dry-etching the dielectric film to form in the dielectric film first and second contact holes that expose surfaces of the base at bottom sections thereof; wherein the amount of etching in forming the first contact hole is less than the amount of etching in forming the second contact hole, the etching gas used for the dry-etching is gas including at least fluorocarbon gas and one of O$_2$ gas and O$_3$ gas, and the temperature of the base is 30° C. or lower when the dry-etching is conducted.

In accordance with the above method for fabricating a semiconductor device, when the dielectric film is dry-etched, the base is kept at temperatures of 30° C. or lower, and gas including at least fluorocarbon gas and one of O$_2$ gas and O$_3$ gas is used as the etching gas. For this reason, the etching selection ratio of the dielectric film against the base is increased to be high. Accordingly, when the first contact hole with a smaller etching amount (depth) and the second contact hole with a larger etching amount (depth) are formed by a single etching step, occurrences of excessive cutting of the base at the first contact hole with the smaller etching amount can be inhibited.

Another method for fabricating a semiconductor device in accordance with certain embodiments of the present invention comprises the steps of: forming a gate electrode on a semiconductor substrate; forming diffusion layers of source/drain regions of the semiconductor substrate; forming a metal silicide film on the gate electrode and the diffusion layers of source/drain regions; forming a silicon oxide film on the metal silicide film; and dry-etching the silicon oxide film to form in the silicon oxide film a first contact hole located over the gate electrode, and a second contact hole located over the diffusing layers in the source/drain regions, wherein etching gas used for the dry-etching is gas including at least fluorocarbon gas and one of O$_2$ gas and O$_3$ gas, and the temperature of the semiconductor substrate is 30° C. or lower when the dry-etching is conducted.

In accordance with the above method for fabricating a semiconductor device, when the silicon oxide film is dry-etched, the base is kept at temperatures of 30° C. or lower, and gas including at least fluorocarbon gas and one of $O_2$ gas and $O_3$ gas is used as the etching gas. For this reason, the etching selection ratio of the silicon oxide film against the metal silicide is increased to be high. Accordingly, when the first contact hole with a smaller etching depth over the gate electrode and the second contact hole with a larger etching depth over the diffusion layer are formed by a single etching step, occurrences of excessive cutting of the metal silicide at the first contact hole with the smaller etching depth can be inhibited.

Also, in the method for fabricating a semiconductor device in accordance with certain embodiments of the present invention, the etching gas may preferably further include CO gas or $CO_2$ gas.

Also, in the method for fabricating a semiconductor device in accordance with certain embodiments of the present invention, the etching gas may preferably further include Ar gas or He gas.

Certain embodiments of the present invention will be described below with reference to the accompanying drawings.

FIGS. 1 through 7 show in cross section a method for fabricating a semiconductor device in accordance with an embodiment of the present invention. FIG. 8 schematically shows a cross-sectional view of a structure of a magnetron plasma etching apparatus, which is one example of a plasma etching apparatus to be used in an etching step shown in FIG. 4.

First, as shown in FIG. 1, an element isolation film is formed on a surface of a silicon substrate 1, and a gate oxide film 2 that is a gate dielectric film is formed by a thermal oxidation method on the silicon substrate 1 between the adjacent element isolation films. As the element isolation film, a structure with LOCOS, semi-recessed LOCOS, shallow trench or the like may be used.

Then, a polycrystal silicon film is deposited on the gate oxide film 2 by a CVD (chemical vapor deposition) method. Next, a photoresist film is coated on the polycrystal silicon film, and the photoresist film is exposed to have it developed such that a resist pattern is formed on the polycrystal silicon film. Then, the polycrystal silicon film is etched using the resist patter as a mask, to form a gate electrode 3 composed of polycrystal silicon on the gate oxide film 2.

Next, impurity ions are ion-implanted in the silicon substrate 1 using the gate electrode 3 and the element isolation films as masks. By this step, low concentration impurity layers 4 are formed in LDD (lightly doped drain) regions in the silicon substrate 1. Then, for example, a silicon nitride film is deposited by a CVD method on the entire surface including the gate electrode 3. Next, the silicon nitride film is etched back, such that sidewalls (sidewall members) 5 are formed at walls at the sides of the gate electrode 3.

Then, impurity ions are ion-implanted in the silicon substrate 1 using the gate electrode 3 and the sidewalls 5 as masks, and a heat treatment is conducted on the silicon substrate 1. As a result, diffusion layers 6 and 7 of source/drain regions are formed in a self-alignment manner in the source/drain regions of the silicon substrate 1. Next, a Ti film 8 is formed by sputtering over the entire surface including the gate electrode 3, the sidewalls 5, the diffusion layers 6 and 7 of source/drain regions and the element isolation films. In this instance, the thickness of the Ti film 8 may be, for example, about 20–40 nm. This thickness of the Ti film 8 can be calculated by dividing a desired thickness of a Ti silicide film by a predetermined constant. In the present embodiment, the constant is about 2.5.

Figure 2:
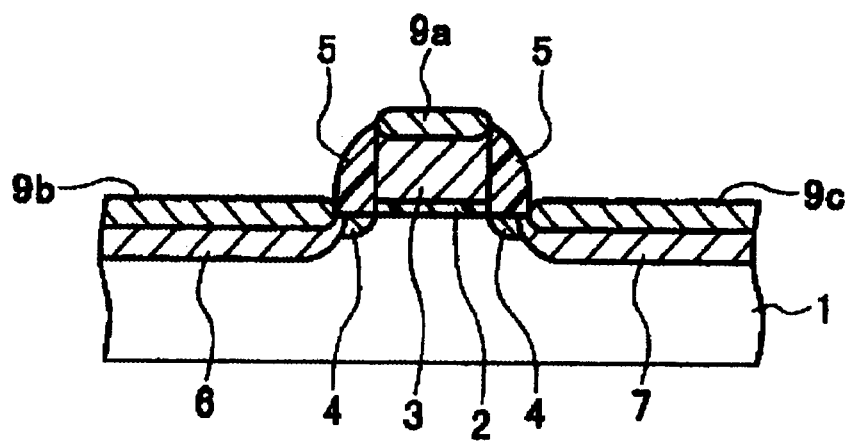
FIG. 2 is a cross-sectional view showing a portion of a method for fabricating a semiconductor device in accordance with an embodiment of the present invention in addition to that shown in FIG. 1.

Next, as shown in FIG. 2, the Ti film 8, the gate electrode 3, and the diffusion layers 6 and 7 of source/drain regions are thermally treated at 700° C. for 30 seconds, for example. By this heat treatment, silicon in the gate electrode 3 and the diffusion layers 6 and 7 reacts with the Ti film 8, whereby Ti silicide films 9a–9c having a thickness of about 50–100 nm are formed on surfaces of the gate electrode 3 and the diffusion layers 6 and 7, respectively. For example, the film thickness of the Ti silicide film may be about 80–100 nm in the case of products in the 0.8 µm design rule, and about 50–60 nm in the case of products in the 0.35 µm design rule.

Then, parts of the Ti film 8 that remain without being silicidized on the sidewalls 5 and the element isolation films are removed by etching. In this instance, an etching solution of ammonia water added with hydrogen peroxide is used. Next, an annealing treatment in which the Ti silicide films 9a–9c are heated at 800° C. for 30 seconds, for example, is conducted. This promotes activation of the semiconductor device, and causes a phase transition in the Ti silicide film from a high resistance crystal structure (C49) to a low resistance crystal structure (C54).

Figure 3:
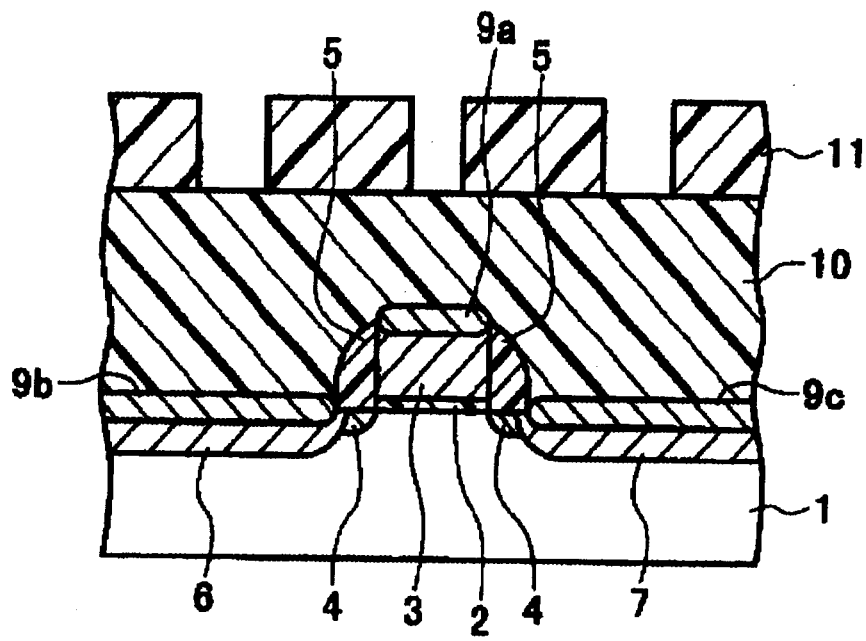
FIG. 3 is a cross-sectional view showing a portion of a method for fabricating a semiconductor device in accordance with an embodiment of the present invention in addition to that shown in FIG. 2.

Next, as shown in FIG. 3, an interlayer dielectric film 10 comprising $SiO_2$ is deposited on the entire surface including the Ti silicide films 9a–9c and the sidewalls 5. Then, a photoresist film is coated on the interlayer dielectric film 10, and the photoresist film is exposed and developed, whereby a resist pattern 11 is formed on the interlayer dielectric film 10.

Figure 4:
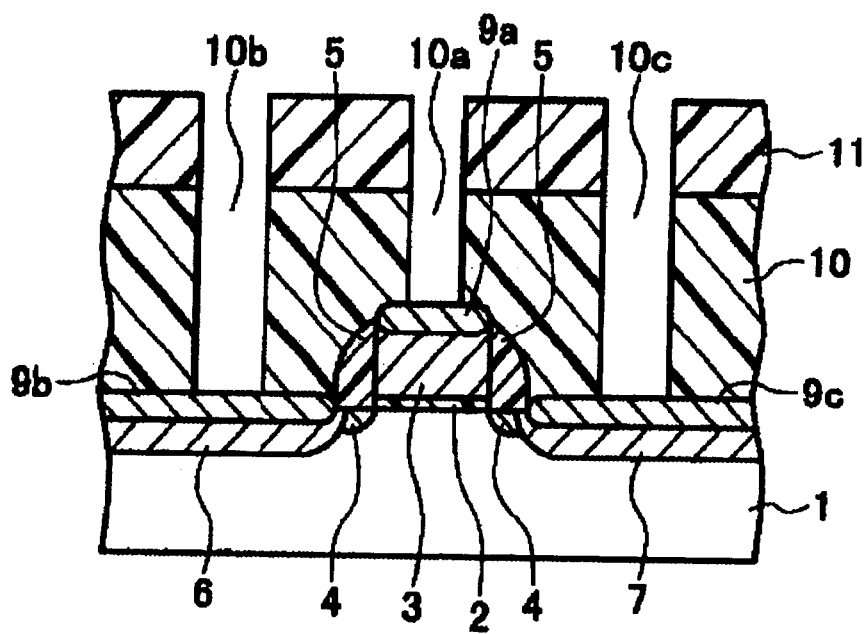
FIG. 4 is a cross-sectional view showing a portion of a method for fabricating a semiconductor device in accordance with an embodiment of the present invention in addition to that shown in FIG. 3.

Next, as shown in FIG. 4, the interlayer dielectric film 10 is etched using the resist pattern 11 as a mask. As a result, contact holes 10a–10c are formed in the interlayer dielectric film 10, located above the Ti silicide films 9a–9c, respectively.

The etching method actually employed in this instance may use a RIE type magnetron plasma etching apparatus such as that shown in FIG. 8, and a mixed gas of $C_4F_8$, $O_2$, Ar and CO as process gas. The magnetron plasma etching apparatus will be described later. In this embodiment, the flow quantity of $C_4F_8$ may preferably be 5–30 sccm, the flow quantity of $O_2$ may preferably be 2–15 sccm, the flow quantity of Ar may preferably be 100–500 sccm, and the flow quantity of CO may preferably be 10–100 sccm.

It is noted that embodiments of the present invention are not limited to these process gases, and other process gases can be used. For example, a mixed gas of another fluorocarbon gas such as $C_5F_6$, He and $CO_2$ can also be used. Certain embodiments include at least a fluorocarbon gas and a gas including oxygen.

The temperature of the wafer, a member that is subject to an etching process, is 30° C. or lower. By conducting an etching process at temperatures of 30° C. or lower, the sidewalls in the contact holes can be formed vertically, and their measurements can be well controlled. A preferred wafer temperature may be about 0° C. Since the photoresist bums itself at high temperatures over 120° C., the photoresist needs to be maintained at low temperatures when etching is conducted. By setting the wafer temperature at 0° C., the surface of the photoresist may reach a temperature of about 70° C. during the etching process.

By etching the interlayer dielectric film 10 in this manner, the etching selection ratio of the interlayer dielectric film composed of $SiO_2$ against the Ti silicide films 9a–9c and the resist pattern 11 can be made high. In other words, by the use of the process gases described above, the etching selection ratio can be improved. Accordingly, occurrences of excessive cutting of the Ti silicide film 9a and the photoresist film above the gate electrode 3 at the contact hole 10*a* with the smaller etching depth can be inhibited.

Figure 5:
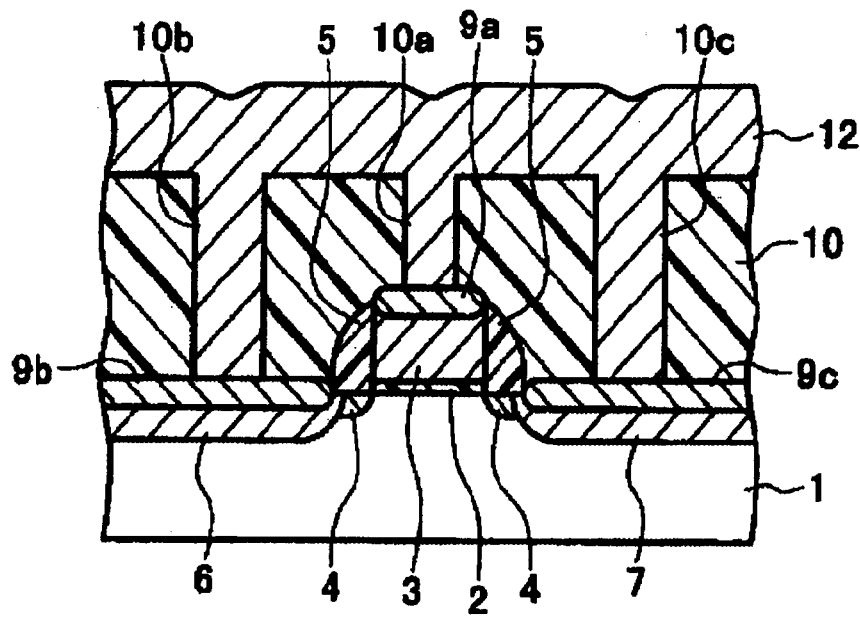
FIG. 5 is a cross-sectional view showing a portion of a method for fabricating a semiconductor device in accordance with an embodiment of the present invention in addition to that shown in FIG. 4.

Next, as shown in FIG. 5, after the resist pattern 11 is removed, a film such as W film 12 is formed in the contact holes 10*a*–10*c* and over the interlayer dielectric film 10 by sputtering.

Figure 6:
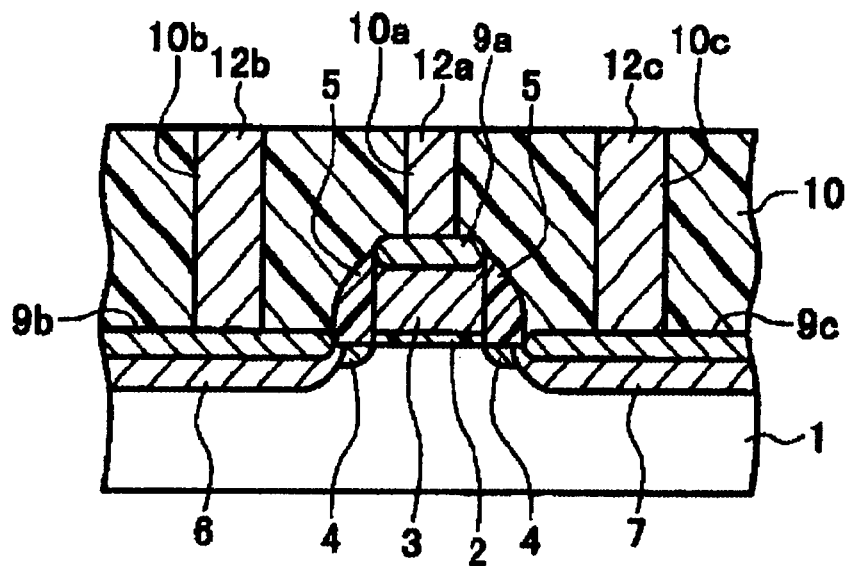
FIG. 6 is a cross-sectional view showing a portion of a method for fabricating a semiconductor device in accordance with an embodiment of the present invention in addition to that shown in FIG. 5.

Then, as shown in FIG. 6, the W film 12 may be, for example, polished by CMP (chemical mechanical polishing) or etching-back until the surface of the interlayer dielectric film 10 is exposed. By this step, the W film is embedded in the contact holes 10*a*–10*c*, whereby W plugs 12*a*–12*c* are formed.

Figure 7:
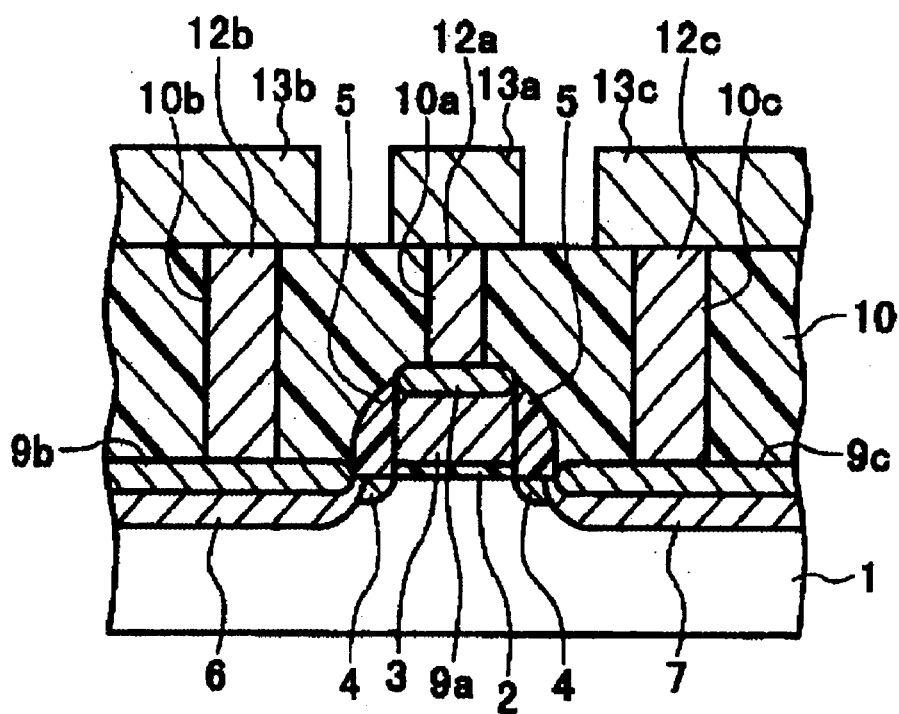
FIG. 7 is a cross-sectional view showing a portion of a method for fabricating a semiconductor device in accordance with an embodiment of the present invention in addition to that shown in FIG. 6.
Figure 8:
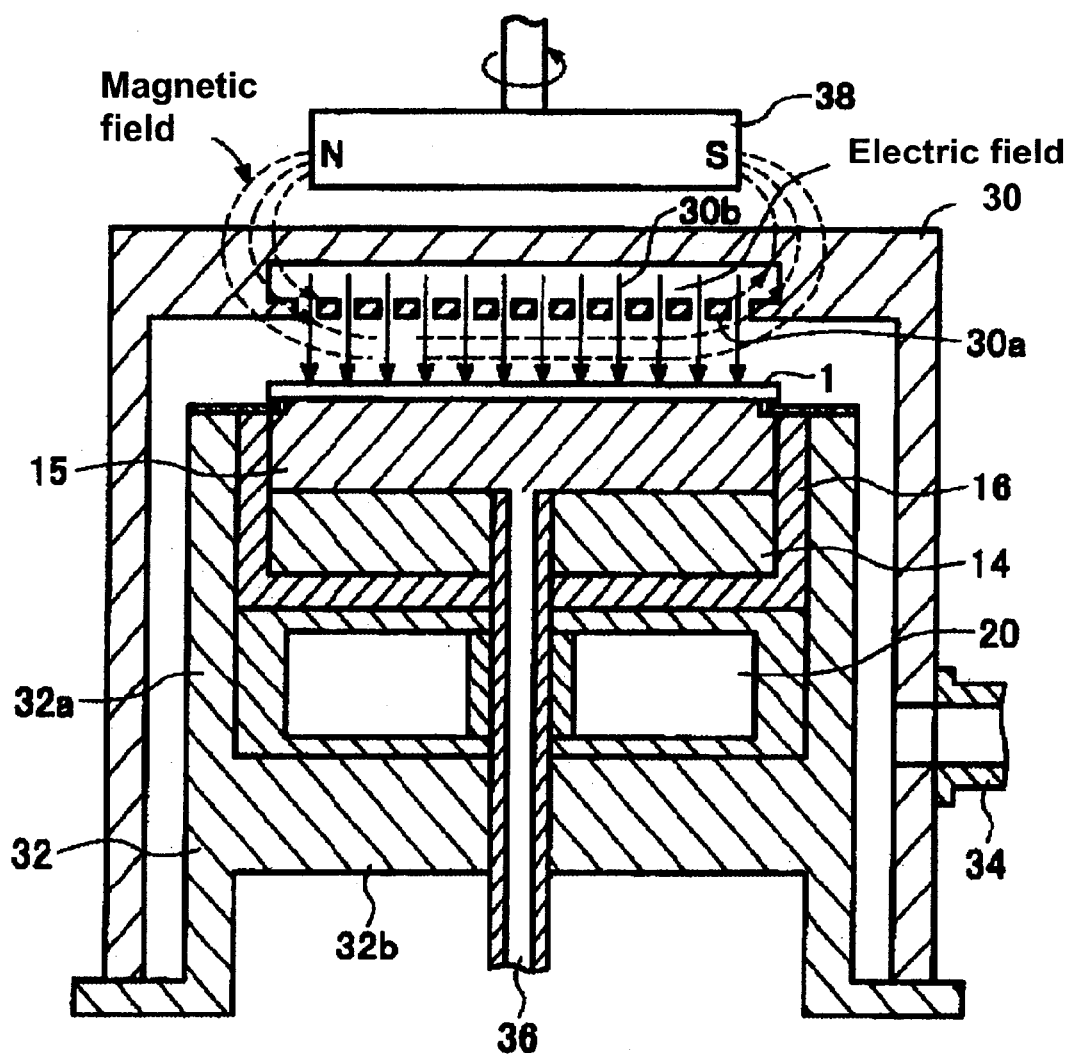
FIG. 8 is a cross-sectional view schematically showing a structure of a magnetron plasma etching apparatus, which is one example of a plasma etching apparatus to be used in the etching step shown in FIG. 4 in accordance with an embodiment of the present invention.

Next, as shown in FIG. 7, a conducting film such as an Al alloy film is deposited by sputtering over the entire surface including the W plugs 12*a*–12*c*. By patterning the Al alloy film, Al alloy wirings 13*a*–13*b* are formed on the W plugs. The Al alloy wiring 13*a* is electrically connected to the gate electrode 3 through the W plug 12*a*, the Al alloy wiring 13*b* is electrically connected to the diffusion layer 6 through the W plug 12*b*, and the Al alloy wiring 13*c* is electrically connected to the diffusion layer 7 through the W plug 12*c*.

Next, the magnetron plasma etching apparatus shown in FIG. 8 is described. The magnetron plasma etching apparatus includes a first suscepter 15. A wafer 1, a member to be processed, is mounted and fixed on the top surface of the first suscepter 15. For example, an electrostatic chuck type device may be used as a system for mounting and fixing. This is a system that attracts and fixes the wafer 1 by Coulomb attraction force. The first suscepter 15 is detachably fixed onto the upper surface of a second suscepter 14.

Side surfaces and bottom surface of the first suscepter 15 and the second suscepter 14 are covered by an insulating ceramic member 16. Also, a liquid nitrogen container section 20 as a cooling section is provided below the insulating ceramic member 16. An internal wall bottom surface of the liquid nitrogen container section 20 is formed to be porous such that nucleate boiling takes place, and the liquid nitrogen within the container can be maintained at −196° C.

A chamber that forms a reaction chamber is composed of an upper chamber 30 and a lower chamber 32. The lower chamber 32 has a bottomed cylindrical portion that exposes only the wafer-mounting surface of the first suscepter 15 to the chamber interior and covers the other parts. In other words, the lower chamber 32 has a sidewall 32*a* that covers side surfaces of the first and second suscepters 15 and 14, the insulating ceramic member 16 and the liquid nitrogen container section 20, and a supporting wall 32*b*. On the other hand, the upper chamber 30 is formed in a cylindrical form that surrounds the circumference of the sidewall 32*a* of the lower chamber 32, and has a lower end side that is fixedly connected to the lower chamber 32. Also, the upper chamber 30 has a face 30*a* that faces an upper surface of the first suscepter 15. Etching gas is introduced by a system through etching gas introduction openings 30*b* provided in the face 30*a*. A vacuum can be drawn through a piping 34 on the reaction chamber formed by the upper chamber 30 and the lower chamber 32.

It is noted that, as shown in FIG. 8, the second suscepter 14, the insulating ceramic member 16 and the liquid nitrogen container section 20 are provided with through holes, respectively, and a piping 36 is disposed along the through holes. Cooling gas (for example, $H_2$ gas or the like) under a specified pressure is introduced through the piping 36. This cools the first suscepter 15, whereby the wafer 1 can be controlled to be at predetermined temperatures at 30° C. or below through the first suscepter 15.

The magnetron plasma etching apparatus uses the surface 30*a* of the upper chamber 30 to function as a cathode electrode and the surface of the first suscepter 15 to function as an anode electrode, to thereby compose a RIE (reactive ion etching) type magnetron plasma etching apparatus. While a vacuum is drawn on the chamber, etching gas is introduced and plasma is generated with the etching gas between the opposing electrodes.

A permanent magnet 38 is disposed outside the upper chamber 30. The permanent magnet 38 is rotated to generate a rotary magnetic field between the face 30*a* of the upper chamber 30 and the first suscepter 15. The reason for forming the magnetic field by the permanent magnet 38 between the face 30*a* of the upper chamber 30 and the first suscepter 15 is to bring electrons into cycloidal movements by interactions between the electric field generated between the surface of the upper chamber 30 and the suscepter 15 and magnetic field components perpendicular to the electric filed by Fleming's left-hand rule in directions respectively perpendicular to one another, and to thereby increase the frequency of collisions of electrons and gas molecules.

In accordance with the embodiment described above, when the interlayer dielectric film 10 is dry-etched using the resist pattern 11 as a mask, the wafer temperature is set at 30° C. or lower, and a mixed gas containing $C_4F_8$, $O_2$, Ar and CO is used as etching gas. For this reason, the etching selection ratio of the interlayer dielectric film composed of $SiO_2$ against the Ti silicide films 9*a*–9*c* and the resist pattern 11 can be made high, compared to the conventional technology. Accordingly, when the contact hole 10*a* with a smaller etching amount over the gate electrode 3 and the contact holes 10*b* and 10*c* with a larger etching amount over the diffusion layers 6 and 7 are formed by a single etching step, occurrences of excessive cutting of the Ti silicide film 9*a* and the photoresist film at the contact hole 10*a* with the smaller etching amount can be suppressed.

It is noted that the present invention is not limited to the embodiments described above, and many changes can be made. Several examples of changes are described next. For example, in the embodiment described above, the Ti silicide films 9*a*–9*c* are formed over the gate electrode 3 and the diffusion layers 6 and 7 of the source/drain regions, respectively. However, without being limited to Ti silicide films, any other silicide film can be formed. For example, W silicide films can be formed over the gate electrode, and the diffusion layers of the source/drain regions, respectively.

Also, in the embodiment described above, the Ti silicide films 9*a*–9*c* are formed over the gate electrode 3 and the diffusion layers 6 and 7 of the source/drain regions, respectively. However, the etching selection ratio can be improved even when Ti silicide films are not formed. In other words, when the base is formed with Si, the etching selection ratio between the interlayer dielectric film 10 that is a film to be etched and Si of the base can be improved.

Also, in the embodiment described above, the present invention is applied to the etching step when the contact holes 10*a*–10*c* are formed. However, embodiments of the present invention are also applicable to an etching step to be conducted to form via holes.

In accordance with certain embodiments of the present invention, a member to be processed is kept at temperatures of 30° C. or lower, and gas including at least fluorocarbon gas and at least one of $O_2$ gas and $O_3$ gas is used as etching gas. Accordingly, certain embodiments of the present invention provide an etching apparatus and a method for fabricating a semiconductor device, in which the etching selection ratio of the member to be processed against metal silicide, Si and photoresist is improved.

What is claimed:

1. A method for fabricating a semiconductor device, the method comprising:

forming a dielectric film on a metal silicide and Si; and dry-etching the dielectric film to form in the dielectric film first and second contact holes that expose surfaces of the metal silicide or the Si;

wherein a depth of etching to form the first contact hole is less than a depth of etching to form the second contact hole, the etching gas used for the dry-etching is gas including a single fluorocarbon gas and at least one of $O_2$ gas and $O_3$ gas, and the dry-etching is conducted using a single step, and the temperature of the base is 30° C. or lower when the dry-etching is conducted.

2. A method for fabricating a semiconductor device according to claim 1, wherein the etching gas further includes at least one of CO gas or $CO_2$ gas.

3. A method for fabricating a semiconductor device according to claim 1, wherein the etching gas further includes at least one of Ar gas or He gas.

4. A method for fabricating a semiconductor device according to claim 2, wherein the etching gas further includes at least one of Ar gas or He gas.

5. A method for fabricating a semiconductor device according to claim 1, wherein, in the dry-etching step, a flow rate of the single fluorocarbon gas and a flow rate of the at least one of $O_2$ gas and $O_3$ gas are not changed during the dry-etching.

6. A method for fabricating a semiconductor device, the method comprising:

forming a gate electrode on a semiconductor substrate;

forming diffusion layers in source/drain regions of the semiconductor substrate;

forming a metal silicide film on the gate electrode and the diffusion layers of source/drain regions;

forming a silicon oxide film on the metal silicide film; and dry-etching the silicon oxide film to form in the silicon oxide film a first contact hole located over the gate electrode, and second contact holes located over the diffusing layers in the source/drain regions, wherein etching gas used for the dry-etching is gas including a single fluorocarbon gas and at least one of $O_2$ gas and $O_3$ gas, the dry-etching is conducted in a single step etching process, and the temperature of the semiconductor substrate is 30° C. or lower when the dry-etching is conducted.

7. A method for fabricating a semiconductor device according to claim 6, wherein the etching gas further includes at least one of CO gas or $CO_2$ gas.

8. A method for fabricating a semiconductor device according to claim 6, wherein the etching gas further includes at least one of Ar gas or He gas.

9. A method for fabricating a semiconductor device according to claim 6, wherein, in the dry-etching step, a flow rate of the single fluorocarbon gas and a flow rate of the at least one of $O_2$ gas and $O_3$ gas are not changed during the dry-etching.

10. A method for fabricating a semiconductor device, the method comprising:

forming a dielectric film on a base comprising at least one material selected from the group of a metal silicide and Si; and dry-etching the dielectric film to form in the dielectric film first and second contact holes that expose surfaces of the base;

wherein a depth of etching to form the first contact hole is less than a depth of etching to form the second contact hole;

wherein the etching gas used for the dry-etching is gas including a single fluorocarbon gas, an inert gas, and a gas containing oxygen;

wherein the dry-etching is conducted using a single step in which a flow rate of the single fluorocarbon gas, a flow rate of the inert gas, and a flow rate of the gas containing oxygen are not changed during the dry-etching, and wherein the temperature of the base is 30° C. or lower when the dry-etching is conducted.

11. A method for fabricating a semiconductor device according to claim 10, wherein the single fluorocarbon gas is $C_5F_6$.

12. A method for fabricating a semiconductor device according to claim 11, wherein the inert gas comprises He and the gas containing oxygen comprises $CO_2$.

13. A method for fabricating a semiconductor device according to claim 11, wherein the single fluorocarbon gas is $C_4F_8$.

14. A method for fabricating a semiconductor device according to claim 12, wherein the inert gas comprises Ar and the gas containing oxygen comprises $O_2$ and CO.

* * * * *